United States Patent
Lu et al.

(10) Patent No.: US 12,227,874 B2
(45) Date of Patent: *Feb. 18, 2025

(54) METHODS FOR DETERMINING SUITABILITY OF CZOCHRALSKI GROWTH CONDITIONS FOR PRODUCING SUBSTRATES FOR EPITAXY

(71) Applicant: GlobalWafers Co., Ltd., Hsinchu (TW)

(72) Inventors: Zheng Lu, O'Fallon, MO (US);
Shan-Hui Lin, Hsinchu (TW);
Chun-Chin Tu, Zhubei (TW);
Chi-Yung Chen, New Teipei (TW);
Feng-Chien Tsai, Zhubei (TW);
Hong-Huei Huang, Shuishang Township (TW)

(73) Assignee: GlobalWafers Co., Ltd., Hsinchu (TW)

( * ) Notice: Subject to any disclaimer, the term of this patent is extended or adjusted under 35 U.S.C. 154(b) by 361 days.

This patent is subject to a terminal disclaimer.

(21) Appl. No.: 17/834,807

(22) Filed: Jun. 7, 2022

(65) Prior Publication Data
US 2022/0403549 A1    Dec. 22, 2022

Related U.S. Application Data

(60) Provisional application No. 63/213,460, filed on Jun. 22, 2021.

(51) Int. Cl.
*C30B 15/20*    (2006.01)
*C30B 15/00*    (2006.01)
(Continued)

(52) U.S. Cl.
CPC .............. *C30B 25/16* (2013.01); *C30B 15/00* (2013.01); *C30B 25/20* (2013.01); *C30B 29/06* (2013.01); *G01N 2021/8461* (2013.01)

(58) Field of Classification Search
CPC ......... C30B 15/00; C30B 15/20; C30B 25/00; C30B 25/02; C30B 25/16; C30B 25/18;
(Continued)

(56) References Cited

U.S. PATENT DOCUMENTS 6,825,487 B2    11/2004    Preece
7,828,893 B2    11/2010    Mueller et al.
(Continued)

FOREIGN PATENT DOCUMENTS

JP    2003142545 A    5/2003

OTHER PUBLICATIONS

Hierms Martin et al: "Materials characterization and device analysis for evaluation of semiconductor processes by highly-sophisticated photoelastic stress measurement technique", Physica Status Solidi. C: Current Topics in Solid State Physics, vol. 12, No. 8, Aug. 1, 2015 (Aug. 1, 2015), pp. 1085-1089.
(Continued)

*Primary Examiner* — Kenneth A Bratland, Jr.
(74) *Attorney, Agent, or Firm* — Armstrong Teasdale LLP

(57) ABSTRACT

Methods for determining suitability of Czochralski growth conditions to produce silicon substrates for epitaxy. The methods involve evaluating substrates sliced from ingots grown under different growth conditions (e.g., impurity profiles) by imaging the wafer by infrared depolarization. An infrared depolarization parameter is generated for each epitaxial wafer. The parameters may be compared to determine which growth conditions are well-suited to produce substrates for epitaxial and/or post-epi heat treatments.

12 Claims, 18 Drawing Sheets

(51) Int. Cl.
*C30B 25/16* (2006.01)
*C30B 25/20* (2006.01)
*C30B 29/06* (2006.01)
*G01N 21/84* (2006.01)

(58) Field of Classification Search
CPC ......... C30B 25/20; C30B 29/00; C30B 29/02; C30B 29/06; G01N 2021/8461
USPC .......... 117/11, 13–15, 19–21, 84–86, 88, 94, 117/101, 200–202, 928, 931–932
See application file for complete search history.

(56) References Cited

U.S. PATENT DOCUMENTS

| | | | |
|---|---|---|---|
| 7,838,398 B2 | 11/2010 | Schauer et al. | |
| 9,005,563 B2 | 4/2015 | von Ammon et al. | |
| 9,240,316 B2 | 1/2016 | Schauer et al. | |
| 2004/0021097 A1* | 2/2004 | Preece | G01N 21/21 250/559.4 |
| 2022/0259762 A1* | 8/2022 | Mangelberger | C30B 15/04 |
| 2022/0403548 A1* | 12/2022 | Lin | G01N 21/21 |

OTHER PUBLICATIONS

Geiler H D et al: "Detection and analysis of crystal defects in silicon by scanning infrared depolarization and photoluminescence heterodyne techniques", Materials Science and Engineering: B, Elsvier, Amsterdam, NL, vol. 91-92, Apr. 30, 2002 (Apr. 30, 2002), pp. 46-50.

User Manual, SIRD—A V411, Scanning Infrared Depolarization, PVA TePla AG, Division Plasma Systems, Germany, May 15, 2007, 144 pages.

* cited by examiner

METHODS FOR DETERMINING SUITABILITY OF CZOCHRALSKI GROWTH CONDITIONS FOR PRODUCING SUBSTRATES FOR EPITAXY

CROSS-REFERENCE TO RELATED APPLICATION

This application claims the benefit of U.S. Provisional Patent Application No. 63/213,460, filed Jun. 22, 2021, which is incorporated herein by reference in its entirety.

FIELD OF THE DISCLOSURE

The field of the disclosure relates to methods for determining suitability of Czochralski growth conditions (e.g., melt impurity profile) to produce silicon substrates for epitaxy and, in particular, for determining slip resistance of such substrates during epitaxy and post-epitaxy thermal treatment.

BACKGROUND

During epitaxial wafer production and during post-epi thermal cycles, slips are often generated. Slip resistance has become an increasingly important capability in advanced integrated circuit fabrication technology. Conventional methods for detecting slip resistance are destructive processes in which the wafer is not preserved for further use. For example, wafers may be stressed in an anneal furnace and the bow of the wafers may be measured as an indicator of wafer strength. Further, conventional processes are not able to evaluate different epitaxial substrates for slip resistance under different epitaxial and post-epi treatments.

Substrates for use in epitaxial wafer production may be grown by the so-called Czochralski process in which a silicon seed crystal is contacted with a silicon melt. The silicon seed crystal and single crystal silicon ingot attached thereto are withdrawn from the melt. A need exits for a reliable and nondestructive processes capable of quantitively evaluating the Czochralski process (e.g., different impurity levels of the melt) for the slip resistance of the resulting substrates under various epitaxial processes and thermal treatments.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for determining suitability of Czochralski growth conditions to produce silicon substrates for epitaxy. A crucible comprising a charge of silicon is heated to cause a silicon melt to form in the crucible. A silicon seed crystal is contacted with the silicon melt. The silicon melt has a first impurity profile. The silicon seed crystal is withdrawn to grow a first single crystal silicon ingot. A first plurality of silicon substrates are sliced from the first single crystal silicon ingot. A front surface of a silicon substrate of the first plurality of silicon substrates is contacted with a silicon-containing gas. The silicon-containing gas decomposes to form an epitaxial silicon layer on the silicon substrate to form a first epitaxial wafer. The first epitaxial wafer is imaged by infrared depolarization to determine a first infrared depolarization parameter. A crucible comprising a charge of silicon is heated to cause a second silicon melt to form in the crucible. A silicon seed crystal is contacted with the second silicon melt. The second silicon melt has a second impurity profile. The first impurity profile of the first melt is different than the second impurity profile of the second melt. The silicon seed crystal is withdrawn to grow a second single crystal silicon ingot. A second plurality of silicon substrates is sliced from the second single crystal silicon ingot. A front surface of a silicon substrate of the second plurality of silicon substrates is contacted with a silicon-containing gas. The silicon-containing gas decomposes to form an epitaxial silicon layer on the silicon substrate to form a second epitaxial wafer. The second epitaxial wafer is imaged by infrared depolarization to determine a second infrared depolarization parameter. Suitability of the first impurity profile and the second impurity profile to produce substrates for epitaxy is determined based on the first and second infrared depolarization parameters.

Another aspect of the present disclosure is directed to a method for determining suitability of a silicon substrate for epitaxy. A silicon substrate is loaded onto a susceptor disposed within a processing reactor. A front surface of the silicon substrate is contacted with a silicon-containing gas. The silicon-containing gas decomposes to form a first epitaxial silicon layer on the silicon substrate. A front surface of the first epitaxial silicon layer is contacted with a silicon-containing gas. The silicon-containing gas decomposes to form a second epitaxial silicon layer on the first epitaxial silicon layer to form an epitaxial wafer. The epitaxial wafer is imaged by infrared depolarization to determine an infrared depolarization.

Yet another aspect of the present disclosure is directed to a method for determining suitability of a silicon substrate for epitaxy. The substrate is heat treated in a first heat treatment step. The substrate is heat treated in a second heat treatment step. The substrate is imaged by infrared depolarization after the first and second heat treatment steps to determine an infrared depolarization parameter.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for determining suitability of silicon substrates for epitaxy, such as by determining the slip resistance of the substrate during epitaxial layer deposition and/or post-epi thermal treatments. In some embodiments, the composition of the melt from which a silicon ingot is grown to produce the substrate of the epitaxial wafer is varied and the resulting epitaxial wafers are imaged by infrared depolarization. Imaging results in one or more infrared depolarization parameters being produced for each imaged wafer. The parameter may be used to determine suitability of the silicon substrate (and the impurity profile of the melt from which it is grown) for epitaxy (e.g., slip resistance).

Figure 1:
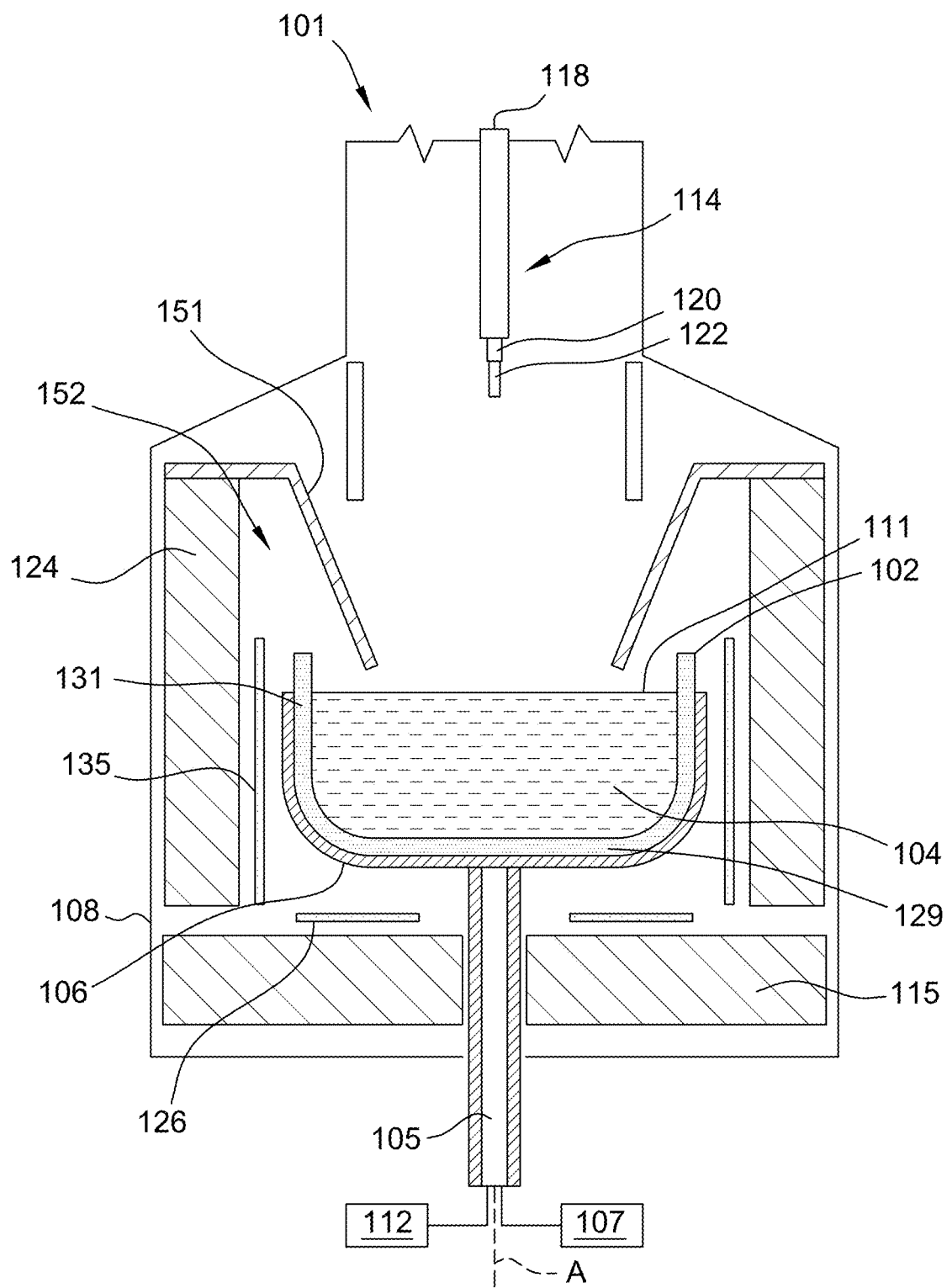
FIG. 1 is a cross-section of an ingot puller apparatus before silicon ingot growth.

The methods of the present disclosure may generally be carried out in any ingot puller apparatus that is configured to pull a single crystal silicon ingot. An example ingot puller apparatus (or more simply "ingot puller") is indicated generally at "101" in FIG. 1. The ingot puller apparatus 101 includes a crucible 102 for holding a melt 104 of semiconductor or solar-grade material, such as silicon, supported by a susceptor 106. The ingot puller apparatus 101 includes a crystal puller housing 108 that defines a growth chamber 152 for pulling a silicon ingot 113 (FIG. 2) from the melt 104 along a pull axis A.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface).

In some embodiments, the crucible 102 is layered. For example, the crucible 102 may be made of a quartz base layer and a synthetic quartz liner disposed on the quartz base layer.

The susceptor 106 is supported by a shaft 105. The susceptor 106, crucible 102, shaft 105 and ingot 113 (FIG. 2) have a common longitudinal axis A or "pull axis" A.

A pulling mechanism 114 is provided within the ingot puller apparatus 101 for growing and pulling an ingot 113 from the melt 104. Pulling mechanism 114 includes a pulling cable 118, a seed holder or chuck 120 coupled to one end of the pulling cable 118, and a silicon seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be withdrawn from the melt 104.

Figure 2:
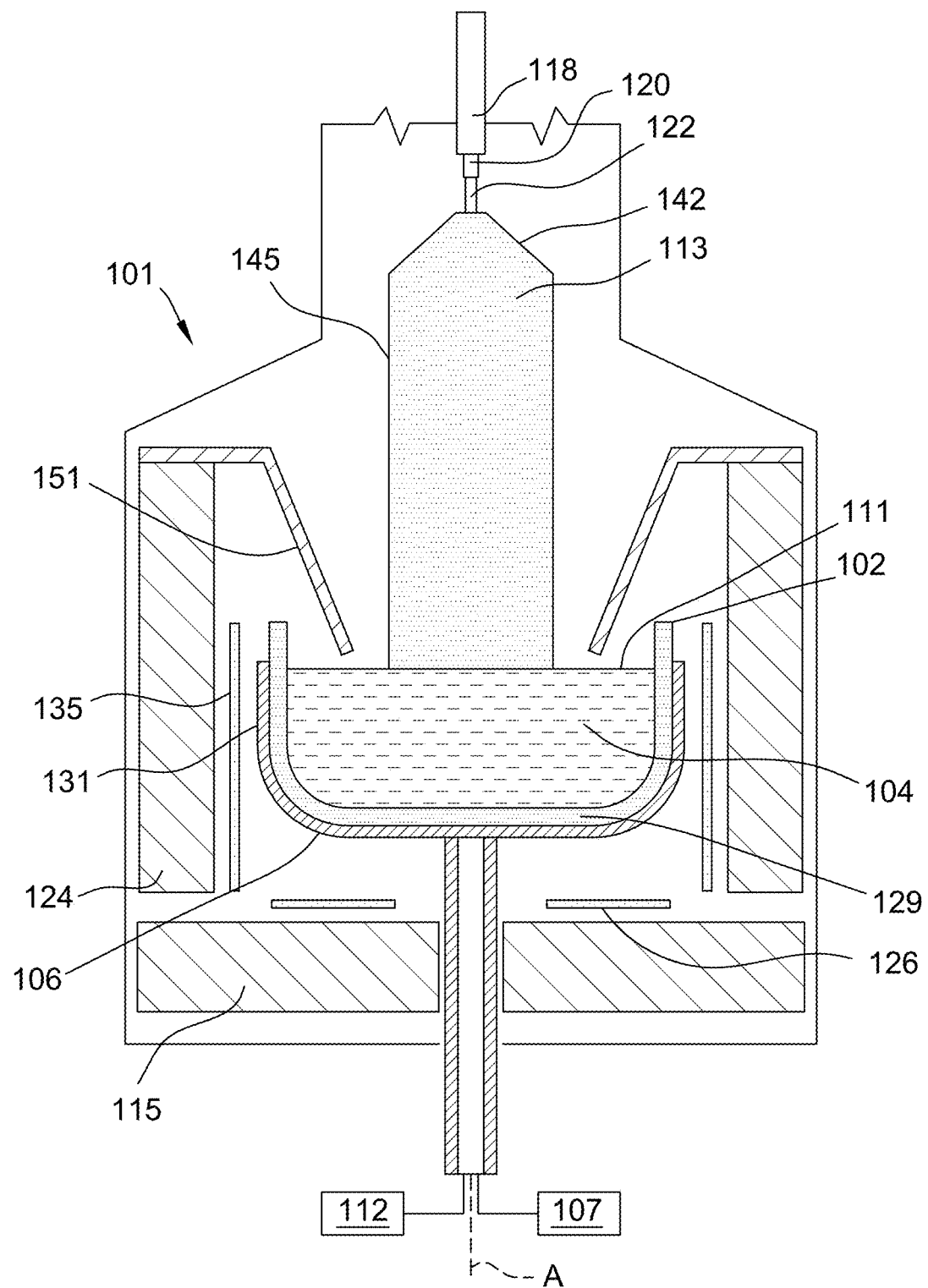
FIG. 2 is a cross-section of the ingot puller apparatus of FIG. 1 during silicon ingot growth.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, the crucible 102 may be at a lowest position (near the bottom heater 126) in which an initial charge of solid-phase polycrystalline silicon previously added to the crucible 102 is melted. Crystal growth commences by contacting the melt 104 with the seed crystal 122 and lifting the seed crystal 122 by the pulling mechanism 114. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 101 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit raises and lowers the ingot 113 relative to the melt surface 111 as desired during the growth process.

The ingot puller apparatus 101 may include an inert gas system to introduce and withdraw an inert gas such as argon from the growth chamber 152. The ingot puller apparatus 101 may also include a dopant feed system (not shown) for introducing dopant into the melt 104.

According to the Czochralski single crystal growth process, a quantity of polycrystalline silicon, or polysilicon, is charged to the crucible 102. The initial semiconductor or solar-grade material that is introduced into the crucible is melted by heat provided from one or more heating elements to form a silicon melt in the crucible. The ingot puller apparatus 101 includes bottom insulation 115 and side insulation 124 to retain heat in the ingot puller apparatus. In the illustrated embodiment, the ingot puller apparatus 101 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 101 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 101 may include a heat shield 151. The heat shield 151 may shroud the ingot 113 and may be disposed within the crucible 102 during crystal growth (FIG. 2).

Figure 5:
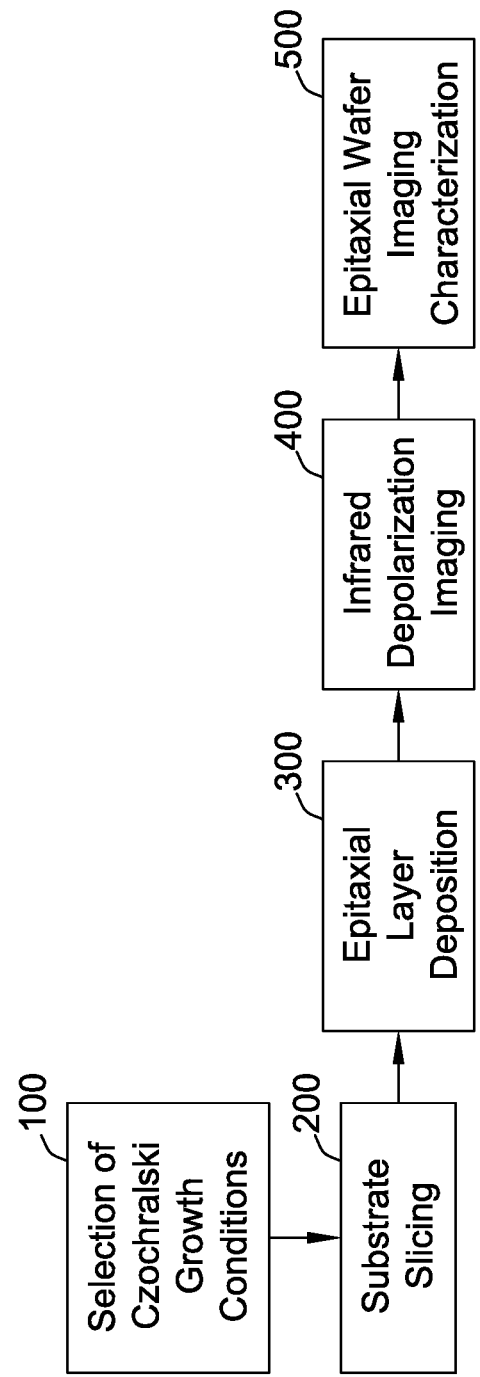
FIG. 5 is a flow chart of an embodiment of a method for determining suitability of a silicon substrate for epitaxy.

In accordance with embodiments of the present disclosure, a Czochralski growth condition is selected in a first step 100 (FIG. 5) to determine suitability of the subsequently sliced substrate for use in epitaxy. For example, an impurity and/or dopant concentration of the crucible melt may be varied to change the characteristics of the resulting substrate upon which the epitaxial layer is formed. For example, one or more of the nitrogen concentration, oxygen concentration, or boron concentration (or other dopant concentration) is varied as further described below. In some embodiments, the concentration of the compound (e.g., oxygen, nitrogen or boron) is changed during growth of a segment of the main body 145 of the ingot 113.

Figure 12:
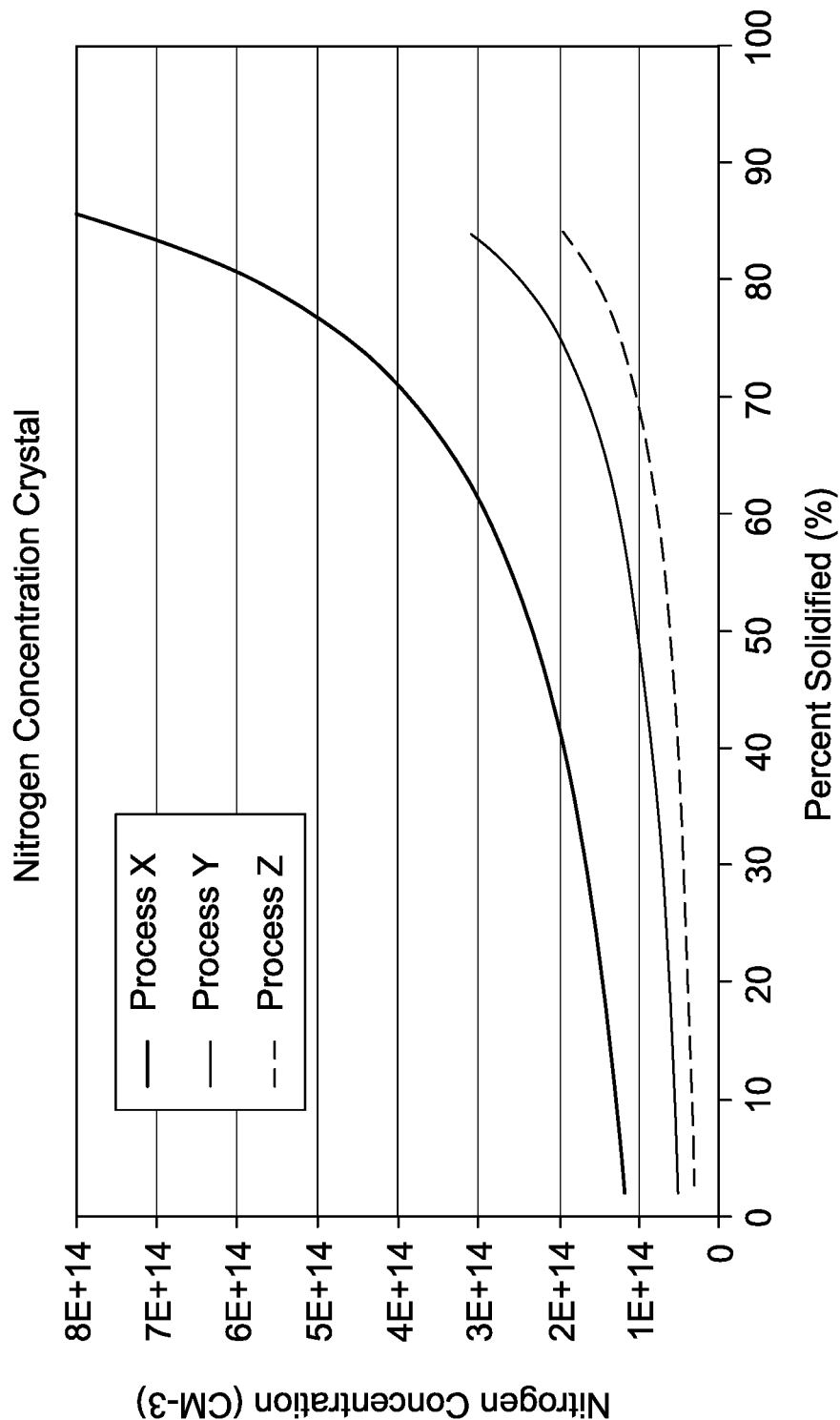
FIG. 12 is a graph of the nitrogen concentration in a single crystal silicon ingot for various starting nitrogen concentrations.

In some embodiments, the nitrogen concentration is varied. Various concentrations of nitrogen may be doped into the ingot. For example and as shown in FIG. 12, nitrogen concentrations in the crystal may be any suitable amount such as from $1 \times 10^{13}$ atoms/cm$^3$ to $1 \times 10^{15}$ atoms/cm$^3$. Nitrogen doping in the ingot follows the segregation curve which means the nitrogen concentration at the beginning of ingot growth and at the end of ingot growth may be 6 to 7 times different, regardless of the starting concentration. To counter such nitrogen concentration differences, the ingot growth conditions may be controlled to control the oxygen concentrations differently at the beginning, middle and/or toward the end of crystal growth according to the nitrogen concentration difference caused by segregation. In addition, the combination of oxygen and nitrogen may be controlled according to epitaxial wafer quality and Scanning Infrared Depolarization (SIRD) measurements, such as after specially designed multiple steps of Epi and/or thermal processes that results in increased slip resistance (e.g., under specific combination of high temperature thermal treatments while maintaining the structure free of epi stacking-faults).

Figure 13:
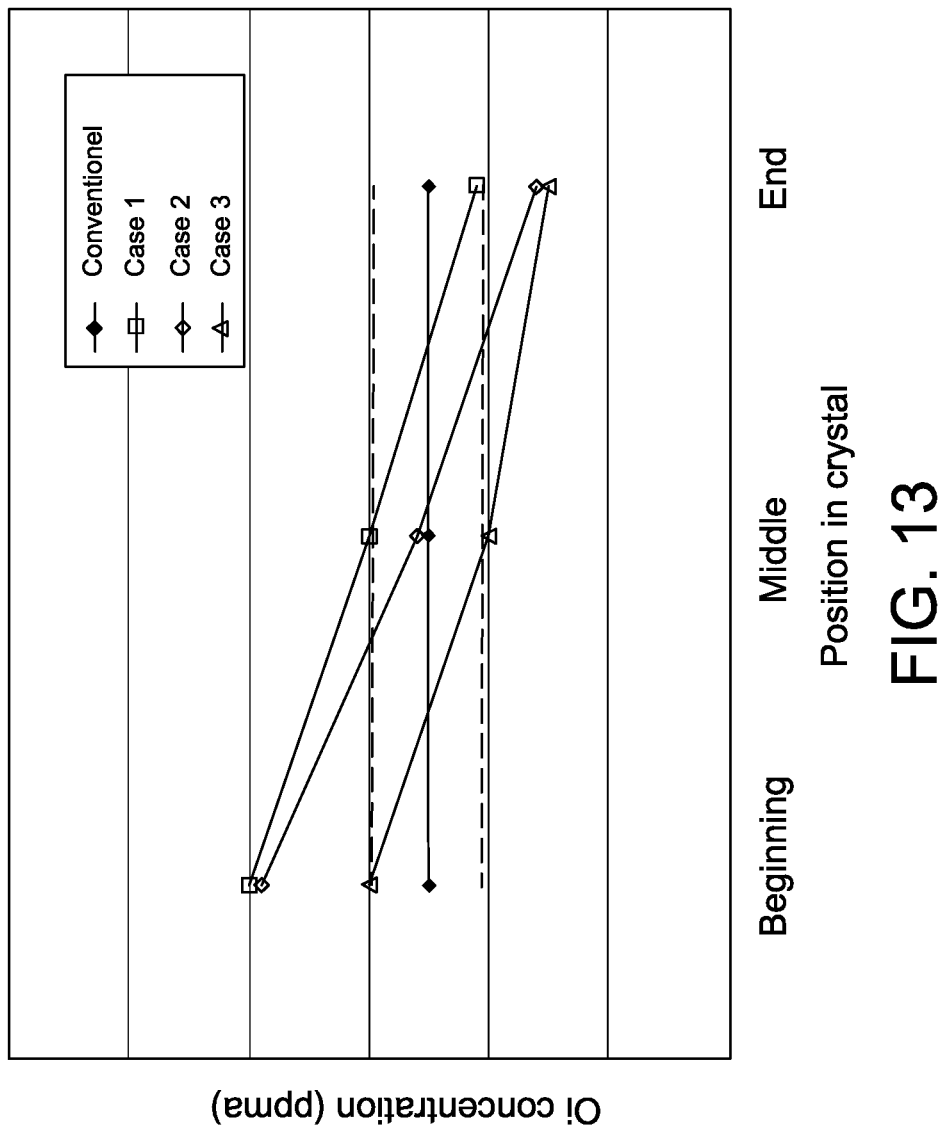
FIG. 13 is a graph of the various oxygen concentrations of the oxygen profile of various ingots used to produce substrates for use in epitaxial layers.

As shown in FIG. 13, the oxygen concentration may be varied (such as by increasing the oxygen concentration at the beginning stage of ingot growth relative to conventional methods and/or decreasing the oxygen concentration at the ending stage of ingot growth relative to conventional methods). In some embodiments, the ingot has an oxygen concentration of less than 12.5 ppma.

The boron concentration of the ingot (and resulting substrates) may be varied (e.g., ranging from lightly doped to heavily doped). For example, the silicon melt may be doped with boron to produce a doped silicon ingot (and sliced wafers) having a boron concentration ranging from $1.0 \times 10^{12}$ to $1.0 \times 10^{20}$ atoms/cm$^3$.

Figure 3:
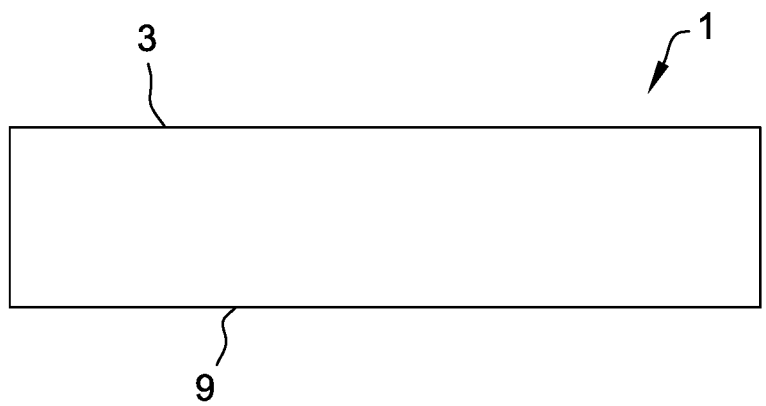
FIG. 3 is a cross-section view of a semiconductor substrate for producing an epitaxial wafer.
Figure 4:
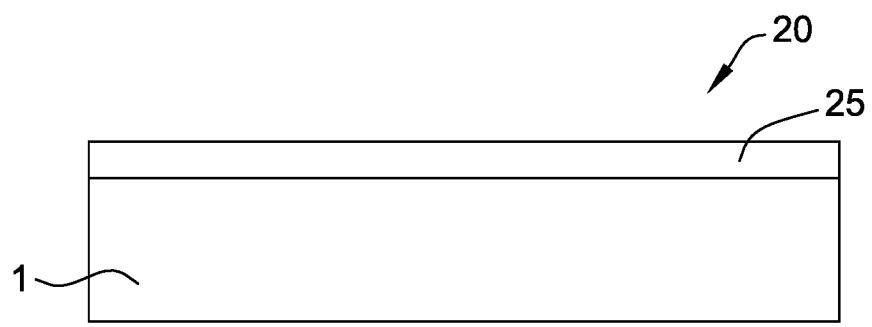
FIG. 4 is a cross-section view of an epitaxial wafer.

Once the ingot 113 has been grown, in a second step 200 (FIG. 5), the ingot 113 is sliced into a plurality of silicon substrates (i.e., wafers) for use in preparing an epitaxial wafer 20 (FIG. 4). The substrate 1 is a single crystal silicon wafer. Referring now to FIG. 3, each substrate 1 has a front surface 3 and a back surface 9.

Figure 14:
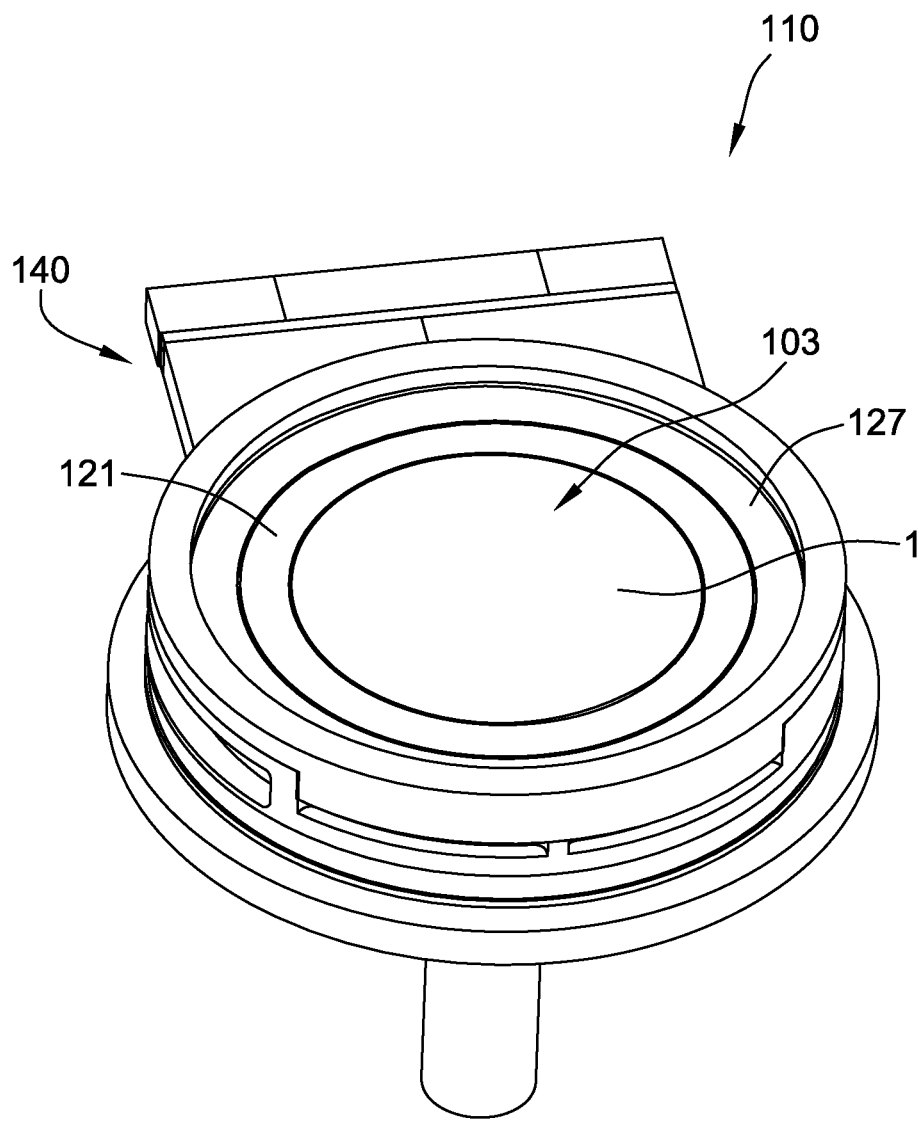
FIG. 14 is a perspective view of a processing reactor for depositing an epitaxial layer on a substrate with a cover of the reactor removed.

Once the substrate 1 has been sliced (e.g., in a first step 100 (FIG. 5)) the substrate 1 may be processed (e.g., sliced from an ingot followed by various steps of smoothing and/or reduction in surface roughness). In a third step 300, an epitaxial layer 25 (FIG. 4) is deposited on the front surface 3 (FIG. 3) of the substrate 1 by contacting the front surface 3 with a silicon-containing gas that decomposes and forms an epitaxial silicon layer 25 on the substrate 1. Generally, any of the methods available to those of skill in the art for depositing a silicon epitaxial layer on a silicon substrate may be used unless stated otherwise. For example, the epitaxial layer 25 may be deposited in the example processing reactor 110 shown in FIG. 14. The reactor 110 includes a processing chamber 103 in which a single semiconductor is etched. A gas manifold 140 is used to direct incoming gas into the processing chamber 103. The incoming process gas flows through the gas manifold 140 and into the processing chamber 103 and is discharged through a gas discharge port. The reactor 110 includes a susceptor 121 disposed within the processing chamber 103 for supporting the substrate 1. A preheat ring 127 surrounds the susceptor 121 to bring process gasses up to temperature before contacting the substrate 1. The substrate 1 is rotated to evenly deposit the epitaxial layer onto the substrate 1.

Silicon may be deposited by epitaxy to any suitable thickness depending on the device application. For example, the silicon may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), atmospheric pressure chemical vapor deposition (APCVD), reduced pressure chemical vapor deposition (RPCVD), or molecular beam epitaxy (MBE). Silicon precursors (i.e., silicon-containing gases) for LPCVD or PECVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, silicon may be deposited by pyrolyzing silane ($SiH_4$) in a temperature range between about 550° C. and about 690° C., such as between about 580° C. and about 650° C. The chamber pressure may range from about 70 to about 400 mTorr.

In some embodiments, a boron-containing gas is introduced into the reactor 110 to dope the epitaxial layer with boron. For example, $B_2H_6$ may be added to the deposition gas. The mole fraction of $B_2H_6$ in the atmosphere used to obtain the desired properties (e.g., resistivity) will depend on several factors, such as the amount of boron out-diffusion from the particular substrate during the epitaxial deposition, the quantity of p-type dopants and n-type dopants that are present in the reactor and substrate as contaminants, and the reactor pressure and temperature.

Once the epitaxial layer 25 is deposited, the epitaxial wafer 20 (which may be referred to herein as a "first" epitaxial wafer) may be imaged by infrared depolarization (step 400 shown in FIG. 5) to determine an infrared depolarization parameter of the wafer 20. The epitaxial wafer 20 may be imaged directly after deposition of the layer or one or more post-epi processes may be performed (e.g., cleaning). Infrared depolarization imaging may be performed on commercially available inspection tools such as the SIRD (Scanning Infrared Depolarization) system sold by PVA TePla America, Inc. (Corona, CA) or the PSI system available from Semilab Semiconductor Physics Laboratory Co., Ltd. (Budapest, Hungary).

Figure 15:
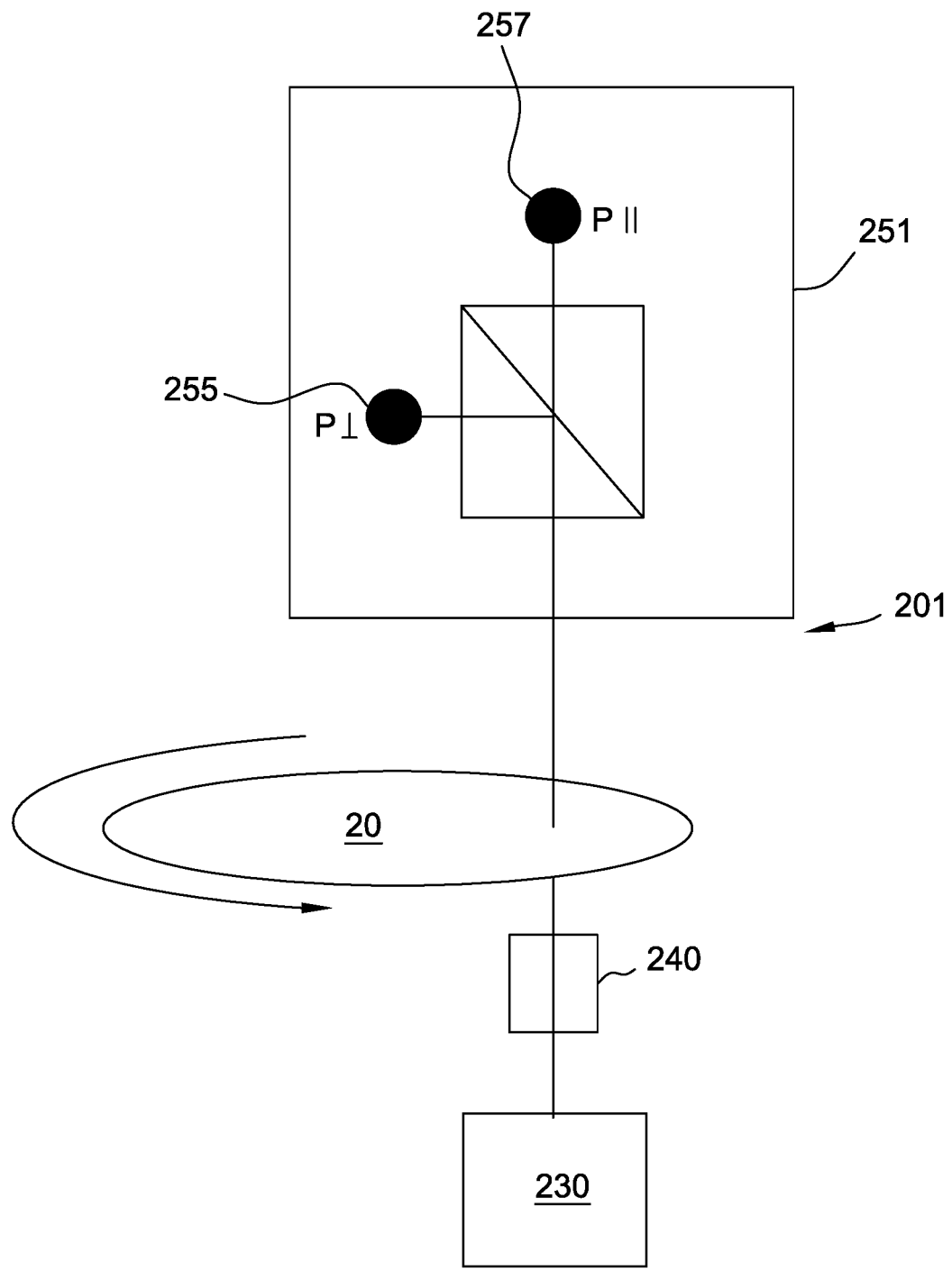
FIG. 15 is a schematic view of an apparatus for imaging epitaxial wafers by infrared depolarization.

An example apparatus 201 for imaging epitaxial wafers 20 is shown in FIG. 15. A laser 230 transmits light through a polarizer 240. The linearly polarized light (e.g., wavelength of about 1.3 μm) penetrates the wafer 20 generally perpendicularly to its surface. While the illustrated apparatus 201 directs light through the back surface of the wafer 20, in other embodiments the apparatus 201 directs light through the front surface. The wafer 20 is rotated while being scanned.

An analyzer 251 measures the linear state of the light that passes through the wafer 20. The analyzer 251 measures the power of the parallel ($P_\parallel$) and perpendicular ($P^\wedge$) electromagnetic field components by diodes 255, 257. Without being bound by any particular theory, it is believed that resident stress fields in the wafer 20 change the polarization state due to stress induced birefringence. Depolarization may be linearly correlated with the local stress in the volume penetrated by the laser light.

Depolarization may be measured as follows:

$$D = 1 - \frac{P_\parallel - P_\perp}{P_\parallel + P_\perp}. \quad (1)$$

Depolarization (D) is a dimensionless value and ranges from 0 to 2. When depolarization (D) approaches zero, little or no birefringence is observed indicating no stress at the imaged wafer site. When depolarization (D) approaches one, circular polarization is present. When depolarization (D) approaches two, a half-plate is indicated (full shift in polarization). Depolarization (D) may be expressed in depolarization units (DU) in which one $DU=10^{-6}*D$. In some embodiments, a global stress defined by the depolarization contrast (DC) may be used:

$$DC = \frac{D_{max} - D_{min}}{\sqrt{D_o}}. \quad (2)$$

In some embodiments, a shear stress equivalent (G) may be determined (see pages 33-39 of the PVA TePla SIRD User Manual (2007)—the User Manual being incorporated herein by reference for all relevant and consistent purposes).

Depolarization may be measured in "tracks" of the scanned surface with each track having a number of "track points" within the track at which depolarization is measured (see page 32 of the PVA TePla SIRD User Manual (2007) which is incorporated by referenced herein). An average may be established for each track and the percentage of track points which deviate from the average may be recorded (i.e., "bad fraction"). The bad fraction of track points may be based on a minimum deviation from the average depolarization of the track (±20% of the average or ±30%, ±40%, or ±50% of the average). Resolution may be adjusted by changing the number of track points measured within a track and by the track separation.

Figure 16:
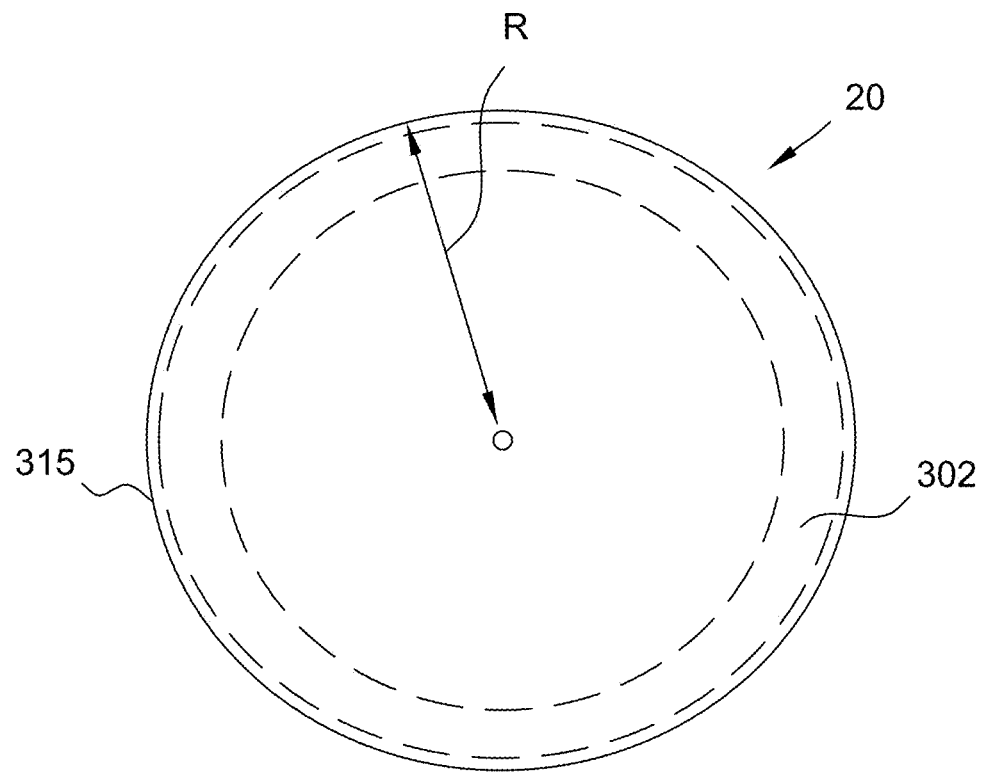
FIG. 16 is a top view of an epitaxial wafer showing an annular edge ring which is imaged by infrared depolarization.
Figure 17:
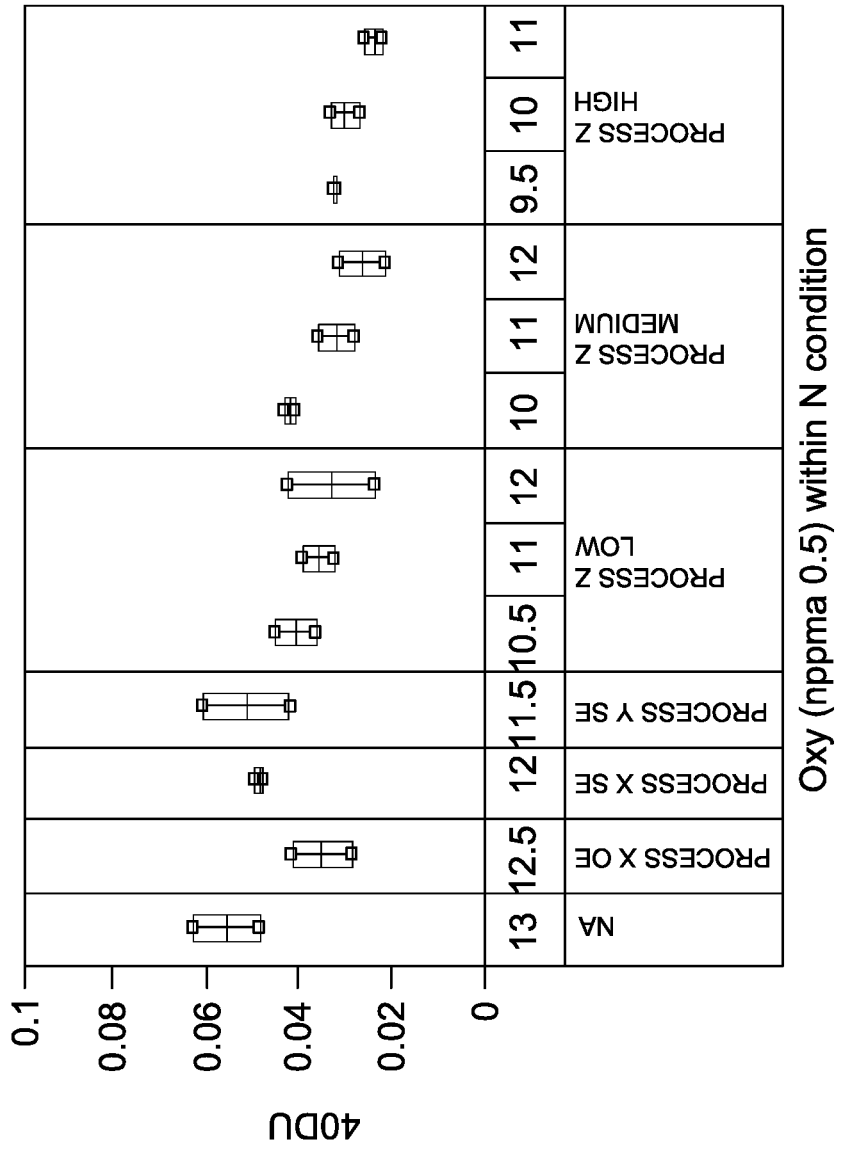
FIG. 17 is a variability plot showing depolarization of epitaxial wafers having substrates sliced from wafers grown from melts having different nitrogen and oxygen concentrations after growth of two epitaxial layers.
Figure 18:
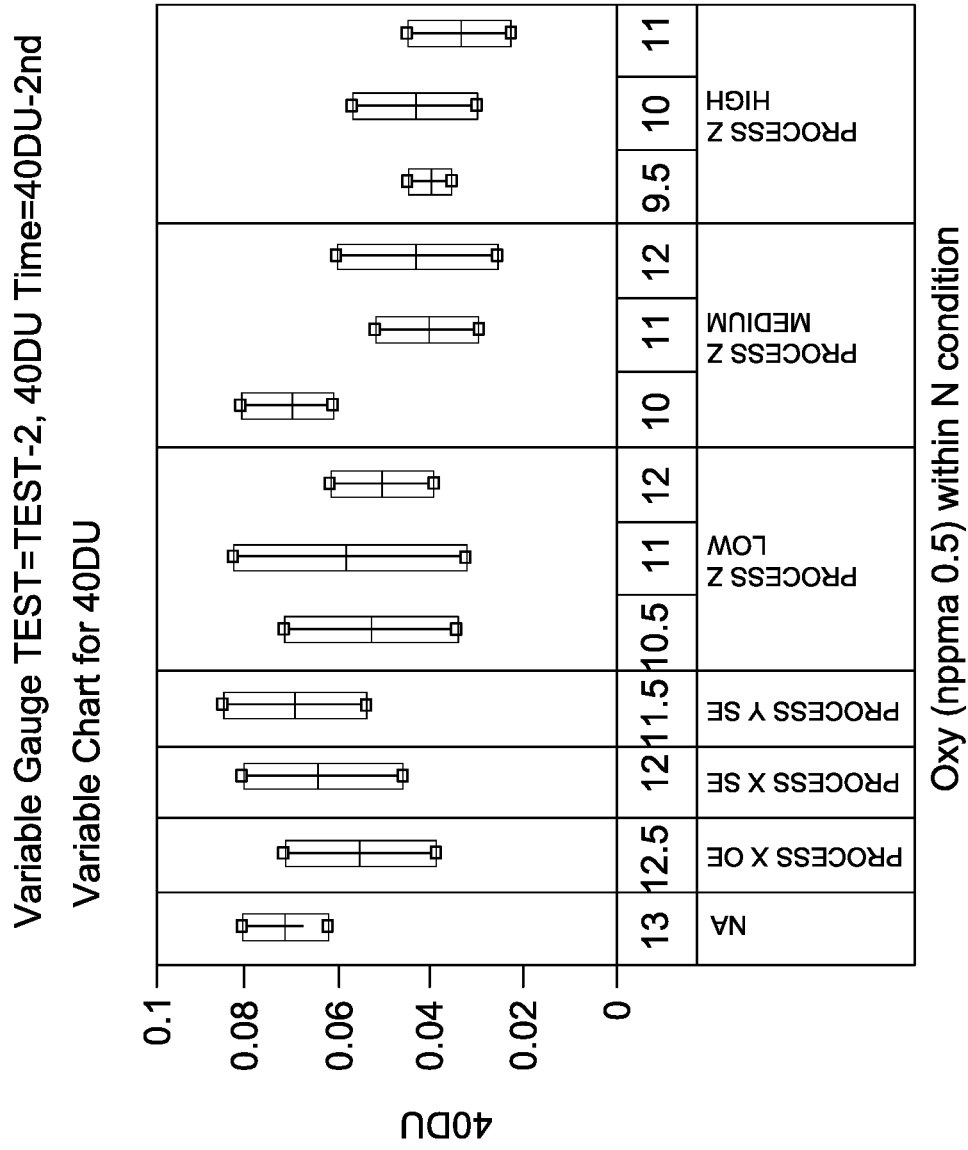
FIG. 18 is another variability plot showing depolarization of epitaxial wafers having substrates sliced from wafers grown from melts having different nitrogen and oxygen concentrations after growth of two epitaxial layers.

Referring now to FIG. 16, in some embodiments of the present disclosure, only an annular edge region 302 of the epitaxial wafer 20 is imaged by infrared depolarization to determine the infrared depolarization parameter. For example, the annular edge region 302 may extend from at least about 85% of the radius R of the epitaxial wafer 20 and toward the circumferential edge 315. In other embodiments, the annular edge region 302 extends from at least about 90% or at least about 95% of the radius R of the epitaxial wafer and toward the circumferential edge 315. The annular edge region 302 may terminate at the circumferential edge 315 or before the edge 315. For example, the annular edge region may extend to 99.5% of the radius R or even 99.9% of the radius R. In other embodiments, rather than imaging the wafer 20 in only an annular edge region, the entire wafer is imaged (optionally with an edge exclusion area not being imaged).

The infrared depolarization parameter of the wafer 20 may generally be any parameter based on a characterization of the wafer imaging (step 400 of FIG. 4). For example, the infrared depolarization parameter may be a wafer map (e.g., an image of the wafer showing defects, stress points, bad fraction track points or other characteristics of the scan). Alternatively or in addition, the parameter may be related to the "bad fraction" of track points (e.g., a bad fraction variability chart, a bad fraction average or the total bad fraction). Alternatively or in addition, the parameter may be related to the depolarization value (e.g., average depolarization value or total depolarization value), the depolarization contrast or the shear stress equivalent.

Once the infrared depolarization parameter is determined, suitability of the substrate for use in epitaxy may be determined. For example, the parameter may be compared to a threshold parameter and/or it may be determined whether the parameter falls within a threshold range.

In some embodiments of the present disclosure, two or more epitaxial wafers sliced from ingots grown from melts having different impurity profiles are imaged by infrared depolarization and their respective infrared depolarization parameters are compared to determine suitability of one or more ingot growth parameters (e.g., one or more impurity profiles) for producing substrates used for epitaxy (e.g., strength and/or slip resistance and optionally after downstream heat treatments). For example, to produce the first epitaxial wafer, after a silicon melt is formed, the seed crystal 122 is contacted with a melt having a first impurity profile (e.g., concentration of oxygen, nitrogen, or boron or other dopants). The seed crystal is withdrawn to form a first single crystal silicon ingot and a first plurality of silicon substrates are sliced from the single crystal silicon ingot. An epitaxial layer is deposited on one of the silicon substrates to form a first epitaxial wafer. The first epitaxial wafer is imaged by infrared depolarization to determine a first infrared depolarization parameter.

In accordance with embodiment of the present disclosure, a second melt is formed (in the same or different crystal puller or even a different crystal puller apparatus) having a second impurity profile (e.g., different impurity profile such as having a different concentration of one or more impurities). A silicon seed crystal (same or different crystal as before) is contacted with second silicon melt and is withdrawn to grow a second single crystal silicon ingot. The second single crystal silicon ingot is sliced into a second plurality of silicon substrates. An epitaxial layer is deposited on one of the silicon substrates to form a second epitaxial wafer. The second epitaxial wafer is imaged by infrared depolarization to determine a second infrared depolarization parameter. Suitability of the first impurity profile and the second impurity profile to produce substrates for epitaxy may be determined based on the first and second infrared depolarization parameters.

In some embodiments, several wafers sliced from each of the first and second ingots may be processed as described above to determine the first and second infrared depolarization parameter (e.g., with the depolarization parameter being averaged for each ingot). For example, epitaxial layers may be deposited on a batch of the first plurality of silicon wafers sliced from the first silicon ingot and epitaxial layers may be deposited on a batch of the second plurality of silicon wafers sliced from the second silicon ingot. The epitaxial wafers of the first batch may be imaged by infrared depolarization to determine the first infrared depolarization parameter and the epitaxial wafers of the second batch may be imaged by infrared depolarization to determine the second infrared depolarization parameter.

In some embodiments, a batch (i.e., a plurality) of ingots are grown from one or more melts having the first impurity profile and/or a batch of ingots are grown from one or more melts having the second impurity profile and the resulting epitaxial wafers may be imaged by infrared depolarization to determine the first and second infrared depolarization parameters. For example, a first batch of single crystal silicon ingots are formed from melts having the first impurity profile. A first plurality of silicon substrates are sliced from two or more single crystal silicon ingots of the first batch and the front surfaces of the first plurality of silicon substrates are contacted with a silicon-containing gas to form a first batch of epitaxial wafers. A second batch of single crystal silicon ingots is formed from melts having the second impurity profile. A second plurality of silicon substrates are sliced from two or more single crystal silicon ingots of the second batch. The front surfaces of the second plurality of silicon substrates is contacted with a silicon-containing gas. The silicon-containing gas decomposes to form an epitaxial silicon layer on the silicon substrates to form a second batch of epitaxial wafers. Each of the epitaxial wafers of the first and second batches of epitaxial wafers is imaged by infrared depolarization to determine the first infrared depolarization parameter and the second infrared depolarization parameter. For example, the depolarization parameter may be averaged for wafers sliced from ingots grown from melts having the first and second impurity profile, respectively.

In accordance with embodiments of the present disclosure, suitability of the impurity profile of the melt (e.g., oxygen, nitrogen, boron, or other dopant or impurity) to produce substrates for epitaxy may be determined based on the first and second infrared depolarization parameters. For example, the first infrared depolarization parameter may be compared to the second infrared depolarization parameter to determine suitability of the impurity profile for epitaxy. Alternatively or in addition, the first and second infrared depolarization parameter may be compared to a threshold parameter (e.g., a parameter in which the slip resistance of the substrate is known to be acceptable). Such threshold parameters may be determined by determining the infrared depolarization parameter of substrates which are known or found to have acceptable slip resistance in epitaxy. In accordance with embodiments of the present disclosure, the first infrared depolarization parameter and the second infrared depolarization parameter are the same parameter.

In embodiments in which two or more epitaxial wafers are imaged, the epitaxial silicon layers may be formed on each of the silicon substrates under the same process conditions (e.g., process times and temperatures). Use of the same or similar process conditions reduces the influence of the process conditions in the slip performance when comparing wafers.

Figure 6:
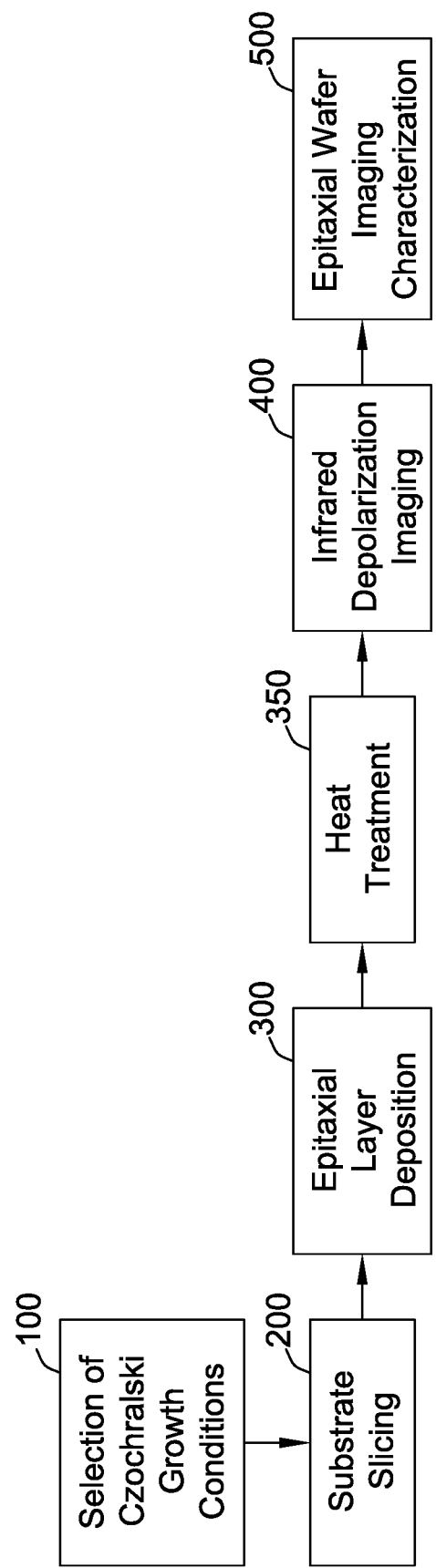
FIG. 6 is a flow chart of another embodiment of a method for determining suitability of a silicon substrate for epitaxy.
Figure 7:
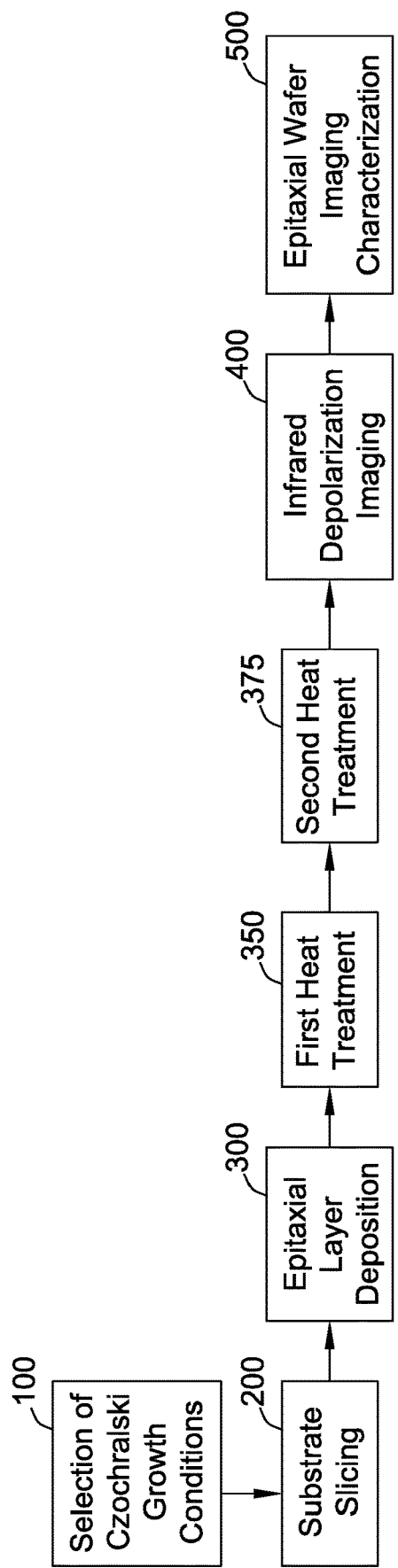
FIG. 7 is a flow chart of yet another embodiment of a method for determining suitability of a silicon substrate for epitaxy.

Referring now to FIG. 6, in some embodiments, after the epitaxial layer is deposited in step 300 and before imaging 400, the wafer may undergo a heat treatment step 350 (e.g., both wafers are heat treated under the same conditions when more than one wafers are imaged). The heat treatment step 350 may mimic a heat treatment used during downstream device fabrication. For example, the heat treatment may involve heating to up to 1150° C. for six or more hours. As shown in FIG. 7, in some embodiments a second heat treatment 375 is performed after the first heat treatment 350 (e.g., heating up to 1150° C. for six or more hours). The second heat treatment 375 may be performed after wafer has cooled after the first heat treatment.

Figure 8:
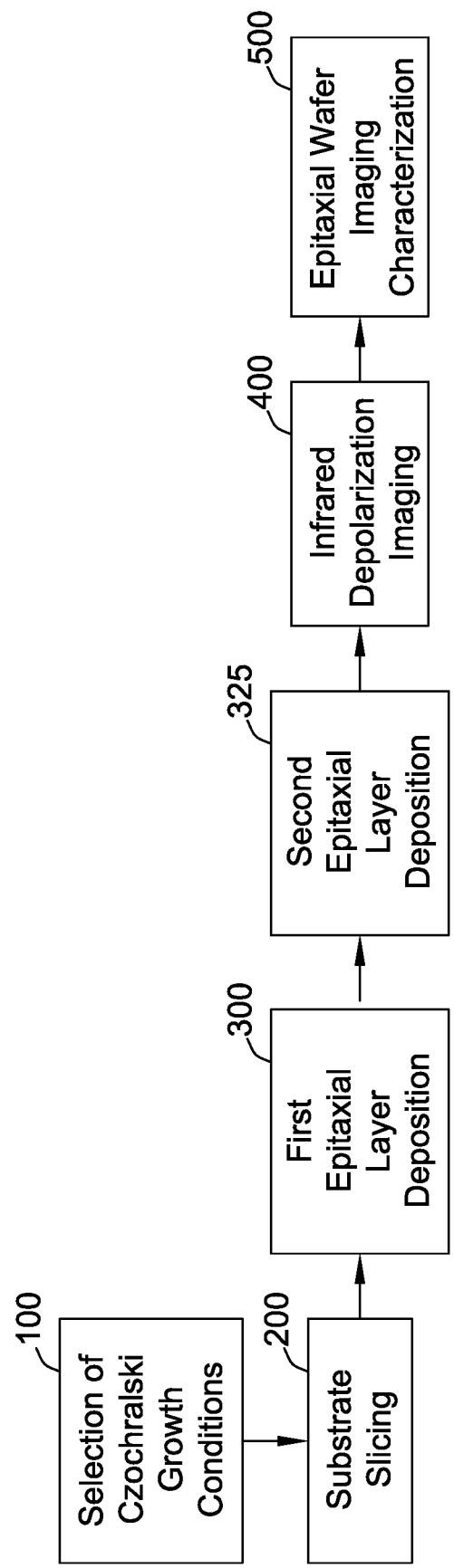
FIG. 8 is a flow chart of a further embodiment of a method for determining suitability of a silicon substrate for epitaxy.
Figure 9:
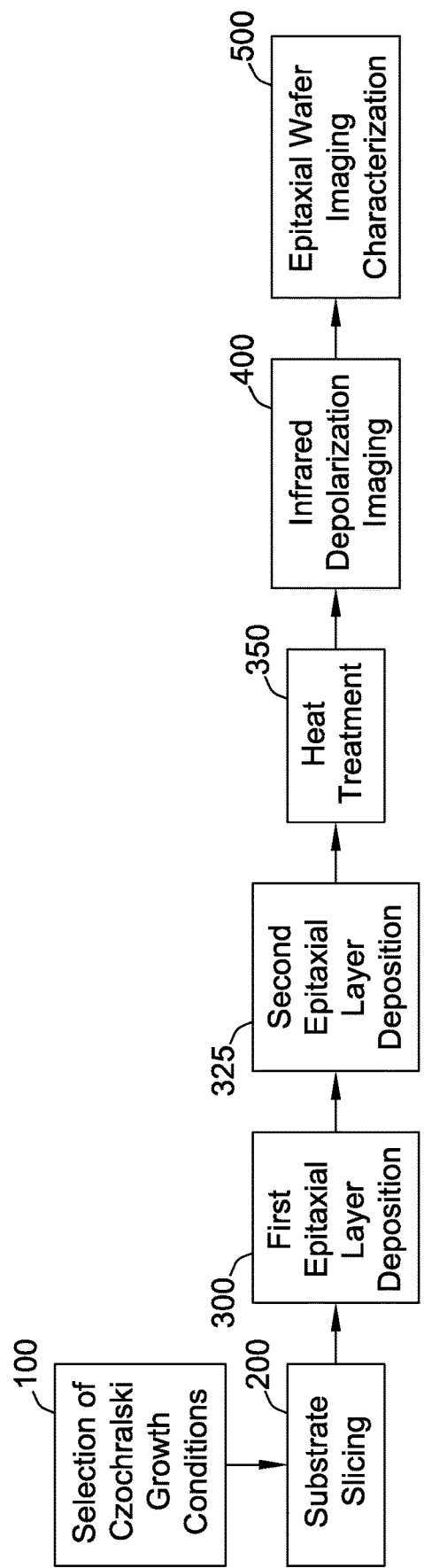
FIG. 9 is a flow chart of yet a further embodiment of a method for determining suitability of a silicon substrate for epitaxy.
Figure 10:
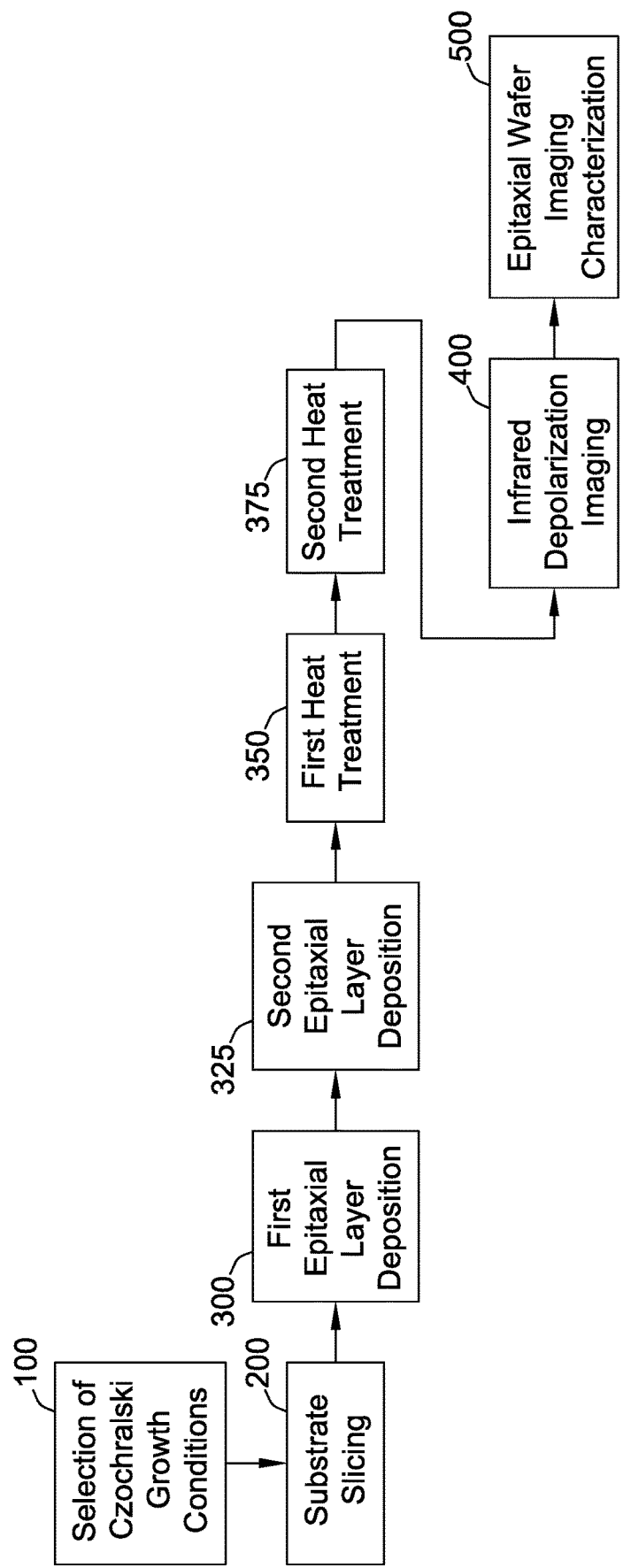
FIG. 10 is a flow chart of another example embodiment of a method for determining suitability of a silicon substrate for epitaxy.

In some embodiments and as shown in FIG. 8, a second epitaxial layer is deposited (step 325) on the first epitaxial layer before infrared depolarization imaging 400. In such embodiments, two strata are present (i.e., two distinct layers) on the surface of the substrate. The second epitaxial layer may be deposited at process conditions similar to deposition of the first layer or different process condition may be used. Optionally a thermal treatment 350 (FIG. 9) may be performed after deposition of the second epitaxial layer 325 (e.g., heating up to 1150° C. for six or more hours). Optionally a second thermal treatment 375 (FIG. 10) may be performed after the first thermal treatment 350. In some embodiments, a heat treatment is performed between deposition of the first and second epitaxial layers.

Figure 11:
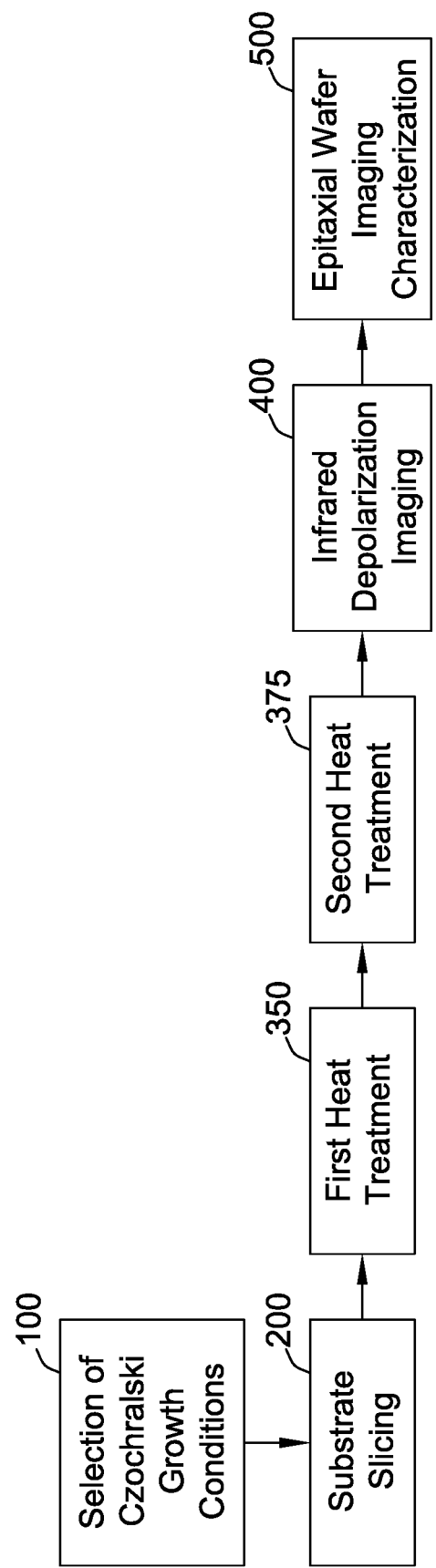
FIG. 11 is a flow chart of another embodiment of a method for determining suitability of a silicon substrate for epitaxy.

Referring now to FIG. 11, in some embodiments an epitaxial layer is not deposited. Instead, two thermal treatments 350, 375 are performed (e.g., in succession).

Compared to conventional methods for determining suitability of one or more Czochralski growth parameters to produce wafers for epitaxy, the methods of the present disclosure have several advantages. The methods are capable of quantitatively characterizing and comparing the slip performance under different epitaxial processes and post-epi thermal treatments when evaluating various types of substrates. The characterization processes are consistent for each tested wafer. The methods are non-destructive which allows the tested wafers to be used commercially after imaging and characterization. In embodiments in which only an edge region of the semiconductor structure is imaged, the epitaxial wafer may be scanned relatively quickly and/or a sharper resolution may be used without an increase in imaging time. Imaging of the edge region is representative of wafer strength as it has been found that the high temperature epi process imposes thermal shock with internal stress fields being present predominantly at the wafer edge. Infrared depolarization is capable of detecting internal stress unlike other methods (e.g., surface scan and XRT) and is characterized by higher sensitivity than other methods. Conventional methods (e.g., XRT) generate only wafer maps and are not quantitative.

In embodiments in which two epitaxial layers are grown on the substrate before imaging, the slips may multiply exponentially which promotes delineation of the slips. Use of two or more heat treatments and/or growth of two or more epitaxial layers may better simulate customer downstream processes.

EXAMPLES

The processes of the present disclosure are further illustrated by the following Examples. These Examples should not be viewed in a limiting sense.

Example 1: Impact of Varying Melt Nitrogen and Oxygen on Slip Resistance and Characterization with Two Epitaxial Layers Czochralski growth conditions were varied to produce different nitrogen and oxygen concentrations in the melt and in the resulting single crystal silicon ingots (300 mm). The substrates underwent two epi growth processes—a 8 μm deposition followed by a 5 μm deposition (both at 1130° C. deposition temperature and 1.8 μm/min deposition rate). The epitaxial wafers were imaged by infrared depolarization (~1.3 μm) on a SIRD apparatus (PVA TePla America, Inc. (Corona, CA)). An annular edge region of each wafer from 144 mm to 149 mm (0.96% to 99.3% of the radius) was scanned. A 5% bad fraction (40 DU) was set as the target upper limit.

Figure 19:
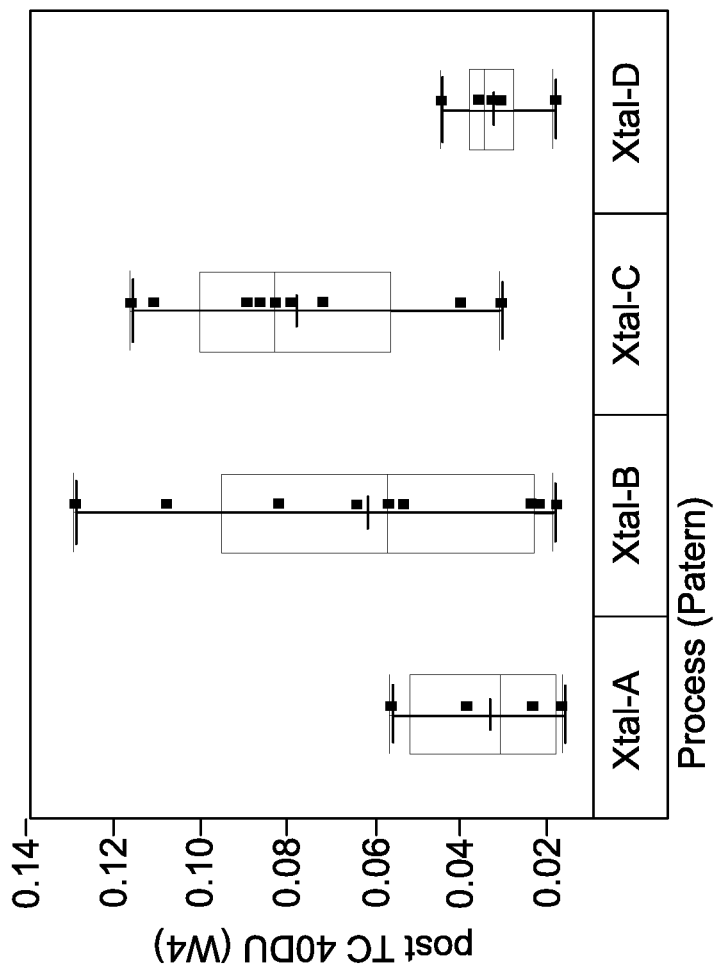
FIG. 19 is a variability plot showing depolarization of substrates sliced from wafers grown from melts having different impurity profiles after two heat treatments.

Example 2: Characterization with Two-Step Heat Treatment without Epitaxial Layer Deposition Czochralski growth conditions were varied to produce different nitrogen and oxygen concentrations in the melt and in the resulting single crystal silicon ingots (300 mm). The substrates underwent two heat treatment steps at 1100° C. for 80 minutes each (without an epitaxial layer deposition). The substrates were imaged by infrared depolarization (~1.3 μm) on a SIRD apparatus (PVA TePla America, Inc. (Corona, CA)). An annular edge region of each wafer from 144 mm to 149 mm (0.96% to 99.3% of the radius) was scanned. A 5% bad fraction (40DU) was set as the target upper limit. As shown in FIG. 19, two crystal types (A and D) met the specification and two ingots did not (B and C).

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for determining suitability of Czochralski growth conditions to produce silicon substrates for epitaxy, the method comprising:
   heating a crucible comprising a first charge of silicon to cause a first silicon melt to form in the crucible;
   contacting a silicon seed crystal with the first silicon melt, the first silicon melt having a first impurity profile;
   withdrawing the silicon seed crystal to grow a first single crystal silicon ingot;
   slicing a first plurality of silicon substrates from the first single crystal silicon ingot;
   contacting a front surface of a silicon substrate of the first plurality of silicon substrates with a first silicon-containing gas, the first silicon-containing gas decomposing to form a first epitaxial silicon layer on the silicon substrate to form a first epitaxial wafer;
   imaging the first epitaxial wafer by infrared depolarization to determine a first infrared depolarization parameter;
   heating a crucible comprising a second charge of silicon to cause a second silicon melt to form in the crucible;
   contacting a silicon seed crystal with the second silicon melt, the second silicon melt having a second impurity profile, the first impurity profile of the first melt being different than the second impurity profile of the second melt;
   withdrawing the silicon seed crystal to grow a second single crystal silicon ingot;
   slicing a second plurality of silicon substrates from the second single crystal silicon ingot;
   contacting a front surface of a silicon substrate of the second plurality of silicon substrates with a second silicon-containing gas, the second silicon-containing gas decomposing to form a second epitaxial silicon layer on the silicon substrate to form a second epitaxial wafer;
   imaging the second epitaxial wafer by infrared depolarization to determine a second infrared depolarization parameter; and
   determining suitability of the first impurity profile and the second impurity profile to produce substrates for epitaxy based on the first and second infrared depolarization parameters, wherein the crucible in which the first silicon melt forms is part of a crystal puller apparatus, the crystal puller apparatus being the same or different from a crystal puller apparatus which comprises the crucible in which the second silicon melt forms, and wherein the silicon seed crystal that contacts the first silicon melt and the silicon seed crystal that contacts the second silicon melt are the same or different silicon seed crystals.

2. The method as set forth in claim 1 wherein determining suitability of the first impurity profile and the second impurity profile to produce substrates for epitaxy comprises comparing the first infrared depolarization parameter to the second infrared depolarization parameter.

3. The method as set forth in claim 2 wherein the first infrared depolarization parameter and the second infrared depolarization parameter are the same parameter.

4. The method as set forth in claim 1 wherein determining suitability of the first impurity profile and the second impurity profile to produce substrates for epitaxy comprises determining the slip resistance of the substrates.

5. The method as set forth in claim 1 wherein the first infrared depolarization parameter and second infrared depolarization parameter are each selected from a wafer map, bad fraction variability chart, bad fraction average, total bad fraction, average depolarization value, total of the depolarization value, depolarization contrast, and shear stress equivalent.

6. The method as set forth in claim 1 wherein the first infrared depolarization parameter and second infrared depolarization parameter are related to a depolarization value.

7. The method as set forth in claim 1 wherein the first impurity profile and second impurity profile relate to the concentration of oxygen, nitrogen, or boron in the melt.

8. The method as set forth in claim 1 further comprising:
heat treating the first epitaxial wafer before imaging the first epitaxial wafer; and
heat treating the second epitaxial wafer before imaging the second epitaxial wafer.

9. The method as set forth in claim 1 wherein the first epitaxial silicon layer is formed on the silicon substrate of the first plurality of substrates to form the first epitaxial wafer under the same process conditions at which the second epitaxial silicon layer is formed on the silicon substrate of the second plurality of substrates to form the second epitaxial wafer.

10. The method as set forth in claim 1 wherein only an annular edge region of the first and second epitaxial wafers is imaged.

11. The method as set forth in claim 1 comprising:
forming a first batch of epitaxial wafers from a batch of the first plurality of silicon substrates;
imaging each epitaxial wafer of the first batch of epitaxial wafers by infrared depolarization to determine the first infrared depolarization parameter;
forming a second batch of epitaxial wafers from a batch of the second plurality of silicon substrates; and
imaging each epitaxial wafer of the second batch of epitaxial wafers by infrared depolarization to determine the second infrared depolarization parameter.

12. The method as set forth in claim 1 comprising:
forming a first batch of single crystal silicon ingots from a plurality of first silicon melts having the first impurity profile, the first single crystal silicon ingot being part of the first batch;
slicing a first plurality of silicon substrates from two or more single crystal silicon ingots of the first batch;
forming a first batch of epitaxial wafers from the first plurality of silicon substrates;
imaging each epitaxial wafer of the first batch of epitaxial wafers by infrared depolarization to determine the first infrared depolarization parameter;
forming a second batch of single crystal silicon ingots from a plurality of second silicon melts having the second impurity profile, the second single crystal silicon ingot being part of the second batch;
slicing a second plurality of silicon substrates from two or more single crystal silicon ingots of the second batch;
forming a second batch of epitaxial wafers from the second plurality of silicon substrates; and
imaging each epitaxial wafer of the second batch of epitaxial wafers by infrared depolarization to determine the second infrared depolarization parameter.

* * * * *